United States Patent
Joharapurkar et al.

(10) Patent No.: US 8,493,356 B2
(45) Date of Patent: Jul. 23, 2013

(54) NOISE CANCELLATION TECHNIQUE FOR CAPACITIVE TOUCHSCREEN CONTROLLER USING DIFFERENTIAL SENSING

(75) Inventors: Ashutosh Ravindra Joharapurkar, Karnataka (IN); Jean CauXuan Le, Sunnyvale, CA (US); Natarajan Viswanathan, Sunnyvale, CA (US); Patrick Chan, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 313 days.

(21) Appl. No.: 12/986,881

(22) Filed: Jan. 7, 2011

(65) Prior Publication Data

US 2011/0261007 A1    Oct. 27, 2011

Related U.S. Application Data

(60) Provisional application No. 61/326,830, filed on Apr. 22, 2010.

(51) Int. Cl.
*G06F 3/045* (2006.01)

(52) U.S. Cl.
USPC ...... 345/174; 345/173; 178/18.01; 178/18.06

(58) Field of Classification Search
USPC ............... 345/173, 174; 178/18.01, 18.05, 178/18.06, 18.07, 19.03
See application file for complete search history.

(56) References Cited

U.S. PATENT DOCUMENTS

| | | | |
|---|---|---|---|
| 4,527,096 A | 7/1985 | Kindlmann | |
| 5,313,141 A | 5/1994 | Kimball | |
| 5,463,283 A | 10/1995 | Sanderson | |
| 5,789,870 A | 8/1998 | Remson | |
| 6,466,036 B1 | 10/2002 | Philipp | |
| 6,937,124 B1 | 8/2005 | Nakamura et al. | |
| 7,061,327 B2 | 6/2006 | Doy | |
| 7,176,753 B2 | 2/2007 | Noda et al. | |
| 7,283,120 B2 | 10/2007 | Grant | |
| 7,667,371 B2 | 2/2010 | Sadler et al. | |
| 2003/0067449 A1 | 4/2003 | Yoshikawa et al. | |
| 2003/0174121 A1 | 9/2003 | Poupyrev et al. | |
| 2006/0119586 A1 | 6/2006 | Grant et al. | |

(Continued)

FOREIGN PATENT DOCUMENTS

WO        9743825        11/2007

OTHER PUBLICATIONS

Non-Final Office Action dated Sep. 29, 2011, U.S. Appl. No. 12/315,690, Filed Dec. 5, 2008, Anthony Stephen Doy.

(Continued)

*Primary Examiner* — Koosha Sharifi-Tafreshi
(74) *Attorney, Agent, or Firm* — Advent, LLP

(57) ABSTRACT

A differential sensing scheme provides a means for detecting one or more touch events on a touch sensitive device in the presence of incident noise. Instead of sensing one touch sensitive channel, such as a row, column, or single touch sensor, multiple touch sensitive channels are sampled at a time. By sampling two nearby channels simultaneously and doing the measurement differentially, noise common to both channels is cancelled. The differential sensing scheme is implemented using simple switch-capacitor AFE circuitry. The originally sensed data on each individual channel is recovered free of common-mode noise. The recovered sensed data is used to determine the presence of one or more touch events and if present the location of each touch event on the touch sensitive device.

30 Claims, 11 Drawing Sheets

U.S. PATENT DOCUMENTS

| | | |
|---|---|---|
| 2008/0055277 A1 | 3/2008 | Takenaka et al. |
| 2008/0062145 A1 | 3/2008 | Shahoian et al. |
| 2010/0156823 A1 | 6/2010 | Paleczny et al. |
| 2011/0260990 A1 | 10/2011 | Ali |
| 2011/0261005 A1 | 10/2011 | Joharapurkar |
| 2011/0261006 A1 | 10/2011 | Joharapurkar |
| 2011/0261007 A1 | 10/2011 | Joharapurkar |
| 2011/0261008 A1 | 10/2011 | Joharapurkar |

OTHER PUBLICATIONS

International Search Report dated Dec. 3, 2009, PCT Patent Application Serial No. PCT/US 09/61359, filed Oct. 20, 2009, Maxim Integrated Products, Inc.

Daniel Carrica et al., "Random Sampling Applied to the Measurement of a DC Signal Immersed in Noise", pp. 1319-1323, IEEE Transactions on Instrumentation and Measurement, vol. 50, No. 5, Oct. 2001.

|  |  | Row 1 | Row 2 | Row 3 | Row 4 | Row 5 | Row 6 | Row 7 | Row 8 | Min from segment |
|---|---|---|---|---|---|---|---|---|---|---|
| S1 | No Touch Single Ended | 2100 | 1900 | 1950 | 2020 | 2050 | 2070 | 1950 | 1970 | |
| S2 | Assumed Code Change due to TOUCH | 0 | 10 | 150 | 0 | 0 | 0 | 0 | 0 | |
| S3 | Touched Single Ended | 2100 | 1910 | 2100 | 2020 | 2050 | 2070 | 1950 | 1970 | |
| S4 | No Touch Differential (Baseline) | 200 | -50 | -70 | -30 | -20 | 120 | -20 | | |
| S5 | Touched Differential | 190 | -190 | 80 | -30 | -20 | 120 | -20 | | |
| S6 | Delta from Baseline | -10 | -140 | 150 | 0 | 0 | 0 | 0 | | |
| S7 | Cumulative Sum | 0 | 10 | 150 | 0 | 0 | 0 | 0 | 0 | 0 |
| S8 | Calculated Code Change due to TOUCH | 0 | 10 | 150 | 0 | 0 | 0 | 0 | 0 | |

Fig. 6

|  | Row 1 | Row 2 | Row 3 | Row 4 | Row 5 | Row 6 | Row 7 | Row 8 | Min from segment |
|---|---|---|---|---|---|---|---|---|---|
| S1 | No Touch Single Ended | 2100 | 1900 | 1950 | 2020 | 2050 | 2070 | 1950 | 1970 | |
| S2 | Assumed Code Change due to TOUCH | 0 | 10 | 150 | 0 | 0 | 180 | 50 | 10 | |
| S3 | Touched Single Ended | 2100 | 1910 | 2100 | 2020 | 2050 | 2250 | 2000 | 1980 | |
| S4 | No Touch Differential (Baseline) | 200 | -50 | -70 | -30 | -20 | 120 | -20 | | |
| S5 | Touched Differential | 190 | -190 | 80 | -30 | -200 | 250 | 20 | | |
| S6 | Delta from Baseline | -10 | -140 | 150 | 0 | -180 | 130 | 40 | | |
| S7 | Cumulative Sum | 30 | 40 | 180 | 30 | 30 | 210 | 80 | 40 | 30 |
| S8 | Calculated Code Change due to TOUCH | 0 | 10 | 150 | 0 | 0 | 180 | 50 | 10 | |

Fig. 8

NOISE CANCELLATION TECHNIQUE FOR CAPACITIVE TOUCHSCREEN CONTROLLER USING DIFFERENTIAL SENSING

RELATED APPLICATIONS

This application claims priority under 35 U.S.C. §119(e) of the U.S. provisional patent application Ser. No. 61/326,830, filed Apr. 22, 2010, and titled "Differential Capacitive Touchpad Circuit and Method," which is hereby incorporated by reference in its entirety.

The following co-owned, co-filed, and co-pending applications, U.S. patent application Ser. No. 12/986,776, titled "Method and Apparatus for Improving Dynamic Range of a Touchscreen Controller", U.S. patent application Ser. No. 12/986,841, titled "Charge Transfer Scheme to Convert Capacitance to Voltage for Touchscreen Controller," U.S. patent application Ser. No. 12/986,991, titled "System Integration of Tactile Feedback and Touchscreen Controller for Near-Zero Latency Haptics Playout," U.S. patent application Ser. No. 12/987,008, titled "Use of Random Sampling Technique to Reduce Finger-Coupled Noise," U.S. patent application No. Ser. 12/986,905, titled "Method and Apparatus for Generating Piezoelectric Transducer Excitation Waveforms Using A Boost Converter," are all also incorporated by reference in their entireties.

FIELD OF THE INVENTION

The present invention relates to the field of capacitive sensor arrays. More particularly, the present invention relates to the field of reducing or eliminating errors in the output of capacitive sensor arrays such as touchscreens.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A capacitive touchscreen panel is coated, partially coated, or patterned with a material that conducts a continuous electrical current across a touch sensor. The touch sensor exhibits a precisely controlled field of stored electrons in both the horizontal and vertical axes to achieve capacitance. The human body is also an electrical device that has stored electrons and therefore also exhibits capacitance. When a reference capacitance of the touch sensor is altered by another capacitance field, such as a finger, electronic circuits located at each corner of the panel measure the resultant distortion in the reference capacitance. The measured information related to the touch event is sent to the controller for mathematical processing. Capacitive sensors can either be touched with a bare finger or with a conductive device being held by a bare hand. Capacitive sensors also work based on proximity, and do not have to be directly touched to be triggered. In most cases, direct contact to a conductive metal surface does not occur and the conductive sensor is separated from the user's body by an insulating glass or plastic layer. Devices with capacitive buttons intended to be touched by a finger can often be triggered by quickly waving the palm of the hand close to the surface without touching.

In capacitive touch applications, the touch sensor acts as an antenna that can pick up ambient noise, such as RF and power supply noise. When used in a touchscreen application, the touch sensors are placed on top of a display screen, such as a liquid crystal display (LCD). Switching noise from the LCD adds significant noise to the touch sensors. When used in an application having an RF transceiver, such as a mobile cell phone, additional noise is picked up by the touch sensors. These noises if not handled correctly may cause a capacitive touch screen controller (CTSC) to detect false touches and report wrong touched coordinates.

SUMMARY OF THE INVENTION

A differential sensing scheme provides a means for detecting one or more touch events on a touch sensitive device in the presence of incident noise. Instead of sensing one touch sensitive channel, such as a row, column, or single touch sensor, multiple touch sensitive channels are sampled at a time. By sampling two nearby channels simultaneously and doing the measurement differentially, noise common to both channels is cancelled. The differential sensing scheme is implemented using simple switch-capacitor analog front-end (AFE) circuitry. The originally sensed data on each individual channel is recovered free of common-mode noise. The recovered sensed data is used to determine the presence of one or more touch events and if present the location of each touch event on the touch sensitive device.

In one aspect, a method of detecting one or more touch events on a touch sensitive device is disclosed. The method includes receiving a plurality of channels, each channel having sensed data corresponding to the touch sensitive device; measuring a capacitance of each channel when no touch event is present on any of the plurality of channels, thereby determining a no touch baseline value for each channel; selecting one of the plurality of channels as a primary channel; selecting another of the plurality of channels as a references channel, wherein the reference channel is different than the primary channel; measuring a capacitance of the primary channel; measuring a capacitance of the reference channel; calculating a difference between the measured capacitance of the primary channel and the measured capacitance of the reference channel, thereby determining a measured difference; calculating a difference between the no touch baseline value for the primary channel and the no touch baseline value for the reference channel, thereby determining a baseline difference; calculating a difference between the measured difference and the baseline difference, thereby determining a delta from baseline for the primary channel and reference channel pair; repeating the steps of selecting one of the plurality of channels as a primary channel, selecting another of the plurality of channels as a references channel, measuring a capacitance of the primary channel, measuring a capacitance of the reference channel, calculating a difference between the measured capacitance of the primary channel and the measured capacitance of the reference channel, and calculating a difference between the no touch baseline value for the primary channel and the no touch baseline value for the reference channel, for each channel in the plurality of channels so that each channel is selected as the primary channel; and determining one or more touch events from the delta from baselines calculated for all primary channel and reference channel pairs.

In some embodiments, the capacitance of the primary channel and the capacitance of the reference channel are measured simultaneously. In some embodiments, each channel is configured having a same shape and size. In some embodiments, each channel is a row sensor in the touch sensitive device or a column sensor in the touch sensitive device. In some embodiments, the touch sensitive device is a two-dimensional touch panel or a one-dimensional virtual slider. The primary channel and the reference channel each have common-mode noise that is removed in the delta from baseline. In some embodiments, the primary channel and the reference channel are adjacent channels. In some embodiments, selecting the primary channel and the reference channel includes enabling the primary channel and the reference channel. In some embodiments, the method also includes recovering the sensed data from the primary channel and the reference channel after calculating the delta from baseline for the primary channel and reference channel pair. In some embodiments, recovering the sensed data includes performing an integration backwards on the delta from baselines calculated for all primary channel and reference channel pairs, wherein the delta from baselines are sequentially calculated forward starting from a first channel to a last channel, and the integration backwards starts from a last delta from baseline calculated to a first delta from baseline. In some embodiments, the method also includes determining a minimum delta from baseline from the delta from baselines determined for all primary channel and reference channel pairs. In some embodiments, the method also includes calculating adjusted sensed data for each channel by subtracting the minimum delta from baseline from the recovered sensed data for each channel. In some embodiments, common mode noise present in the sensed data is not present in the adjusted sensed data. In some embodiments, determining one or more touch events includes determining multiple touch events.

In yet another aspect, another method of detecting one or more touch events on a touch sensitive device is disclosed. The method includes receiving a plurality of channels, each channel having sensed data corresponding to the touch panel; determining a capacitance of each channel when no touch event is present on any of the plurality of channels, thereby determining a no touch baseline value for each channel; selecting two of the plurality of channels and calculating a difference between the no touch baseline value for the two channels, thereby determining a baseline difference; measuring a capacitance of each of the selected two channels; calculating a difference between the measured capacitances of the two channels, thereby determining a measured difference where a common-mode noise present in both of the selectively measured two channel is removed; calculating a difference between the measured difference and the baseline difference, thereby determining a delta from baseline for the two channels; repeating the steps of selecting two of the plurality of channels and calculating a difference between the no touch baseline value for the two channels, measuring a capacitance of each of the selected two channels, calculating a difference between the measured capacitances of the two channels, and calculating a difference between the measured difference and the baseline difference, for additional channel pairs in the plurality of channels; recovering the sensed data from all the delta from baselines for the channel pairs, wherein the recovered sensed data does not include common-mode noise present in the sensed data; and determining one or more touch events from the recovered sensed data.

In yet another aspect, another method of detecting one or more touch events on a touch panel is disclosed. The method includes receiving a plurality of channels, each channel having sensed data corresponding to the touch panel; determining a capacitance of each channel when no touch event is present on any of the plurality of channels, thereby determining a no touch baseline value for each channel; selecting N of the plurality of channels and calculating a difference between the no touch baseline value for the N channels, thereby determining a baseline difference; measuring a capacitance of each of the selected N channels; calculating a difference between the measured capacitances of the N channels, thereby determining a measured difference where a common-mode noise present in the selectively measured N channels is removed; calculating a difference between the measured difference and the baseline difference, thereby determining a delta from baseline for the N channels; repeating the steps of selecting N of the plurality of channels and calculating a difference between the no touch baseline value for the N channels, measuring a capacitance of each of the selected N channels, calculating a difference between the measured capacitances of the N channels, thereby determining a measured difference where a common-mode noise present in the selectively measured N channels is removed, and calculating a difference between the measured difference and the baseline difference, for additional channel sets in the plurality of channels; recovering the sensed data from all the delta from baselines for the channel sets, wherein the recovered sensed data does not include common-mode noise present in the sensed data; and determining one or more touch events from the recovered sensed data.

BRIEF DESCRIPTION OF THE DRAWINGS

The accompanying drawings, which are incorporated in and form a part of this specification, illustrate embodiments of the differential sensing scheme and, together with the description, serve to explain the principles of the haptic feedback system, but not limit the invention to the disclosed examples.

FIG. 6 illustrates an exemplary set of measurements and calculations corresponding to implementation of the differential sensing scheme in a single touch application.

FIG. 8 illustrates an exemplary set of measurements and calculations corresponding to implementation of the differential sensing scheme in a multi-touch application.

FIG. 13 shows an histogram of raw data captured for single ended measurements on a 7" touch panel with LCD on.

FIG. 14 shows an histogram of raw data captured for next-neighbor differential sensing measurements on the same 7" panel with LCD on.

DETAILED DESCRIPTION OF THE EMBODIMENTS

Figure 1:
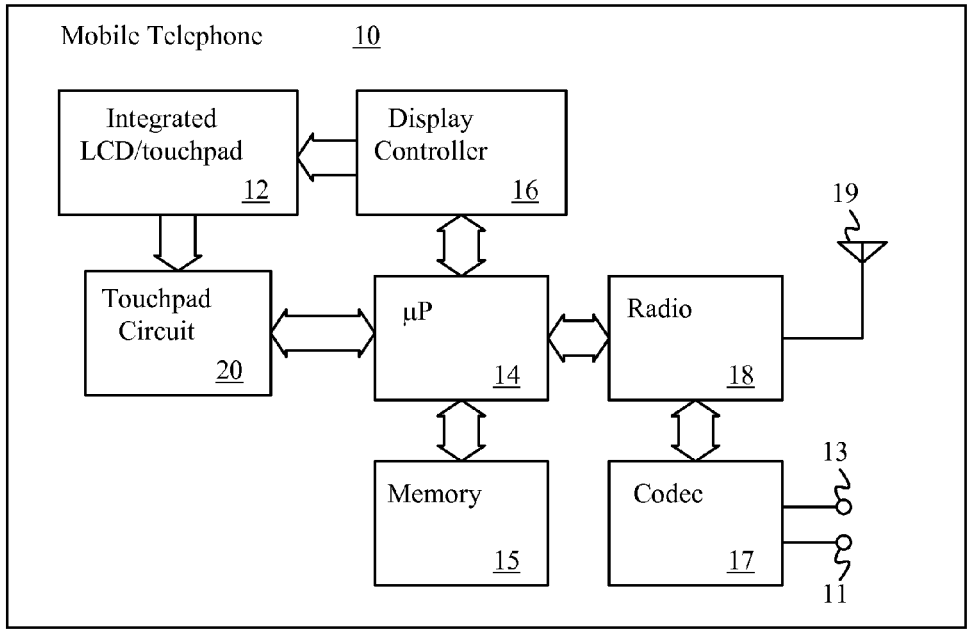
FIG. 1 illustrates a block diagram of exemplary application using the differential sensing scheme.

Embodiments of the present invention are directed to a differential sensing scheme. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

While the differential sensing scheme will be described in conjunction with the embodiments below, it will be understood that they are not intended to limit the methods and systems of these embodiments and examples. On the contrary, the differential sensing scheme is intended to cover alternatives, modifications and equivalents, which may be included within the spirit and scope of the differential sensing scheme as defined by the appended claims. Furthermore, in the following detailed description, numerous specific details are set forth in order to more fully illustrate the methods and systems. However, it will be apparent to one of ordinary skill in the prior art that the methods and systems may be practiced without these specific details.

In accordance with the present application, some of the components, process steps, and/or data structures may be implemented using various types of processing systems, including hardware, software, or any combination thereof. In addition, those of ordinary skill in the art will recognize that devices of a less general purpose nature, such as hardwired devices, application specific integrated circuits (ASICs), or the like, may also be used without departing from the scope and spirit of the inventive concepts disclosed herein.

A differential sensing scheme includes techniques for reducing or eliminating errors in the output of capacitive sensor arrays such as touchpads, touchscreens, touch sliders and the like, including touch sensors that detect the presence and position of a stylus, as well as those that detect and determine finger position. The differential sensing scheme describes a means of extracting a touch event related signal in the presence of extraneous signals. While the illustrative embodiment described herein is applied in a mobile telephone, it is understood that capacitive touch sensors are used in a wide variety of devices. Examples of such devices include, but are not limited to, portable devices, such as personal digital assistants (PDAs), global positioning systems (GPS) receivers, as well as larger devices such as touch-screen enabled displays and computer systems, as well as appliances.

FIG. 1 illustrates a block diagram of exemplary application using the differential sensing scheme. A mobile telephone 10 includes a microprocessor 14 coupled to a memory 15 that stores program instructions for execution by microprocessor 14, and generally includes non-volatile storage for such program instructions, as well as temporary storage for use by microprocessor 14. The program instructions stored in memory 15 include program instructions forming computer program products in accordance with embodiments of the present invention that determine the position of one or more fingers and/or styli at the surface of a touch sensor array included in an integrated liquid crystal display (LCD)/touchpad 12. The LCD/touchpad 12 is coupled to a touchpad circuit 20 in accordance with an embodiment of the present invention that includes the capability of simultaneously measuring the capacitance of two or more touch sensitive channels of the touchpad within LCD/touchpad 12. Alternatively, as will be described in further detail below, the differential sensing scheme may be implemented by integrating a voltage present on the two or more channels which is generally produced by providing a reference potential to another layer. Integrator circuit(s) may be provided to perform the integration, or the differential sensing scheme may implement program instructions within memory 15 that measure the voltages present on the two or more channels, from simultaneous samples of the voltages and integrate the voltages. The mobile telephone 10 also includes a display controller 16 for coupling microprocessor 14 to the LCD within integrated LCD/touchpad 12 and radio circuits 18 for providing wireless telephone connections. Mobile telephone 10 also includes an audio codec 17 coupled to a microphone 13 and a speaker element 11 that provide for voice communications with a user.

Each touch sensor in the touchpad measures a change in capacitance. The touchpad circuit 20 converts the sensed capacitance change to a voltage. Noise present in the system can alter the change in capacitance perceived by the capacitive touch sensors, making it indistinguishable from a real touch event. Since the capacitive touch sensors are typically placed right on top of a LCD screen, switching noise from the LCD can cause the touchpad circuit 20 to report false touches.

In the differential sensing scheme, the capacitance of two or more channels such as two or more rows/columns of a two-dimensional touch sensor array or two or more elements of a one-dimensional touch sensor array, such as a slider, are measured simultaneously, either directly, or by measuring a voltage present on the elements. The measurements are subtracted to yield a measurement free of common-mode error that is primarily due to incident noise, such as that produced by operation of the LCD, the radio circuits 18, any backlight or other power supply under integrated LCD/touchpad 12 and other external environmental sources of noise. All sources that contribute incident noise, or common-mode noise, sensed at a touch sensor are collectively referred to as "noise sources."

Figure 2:
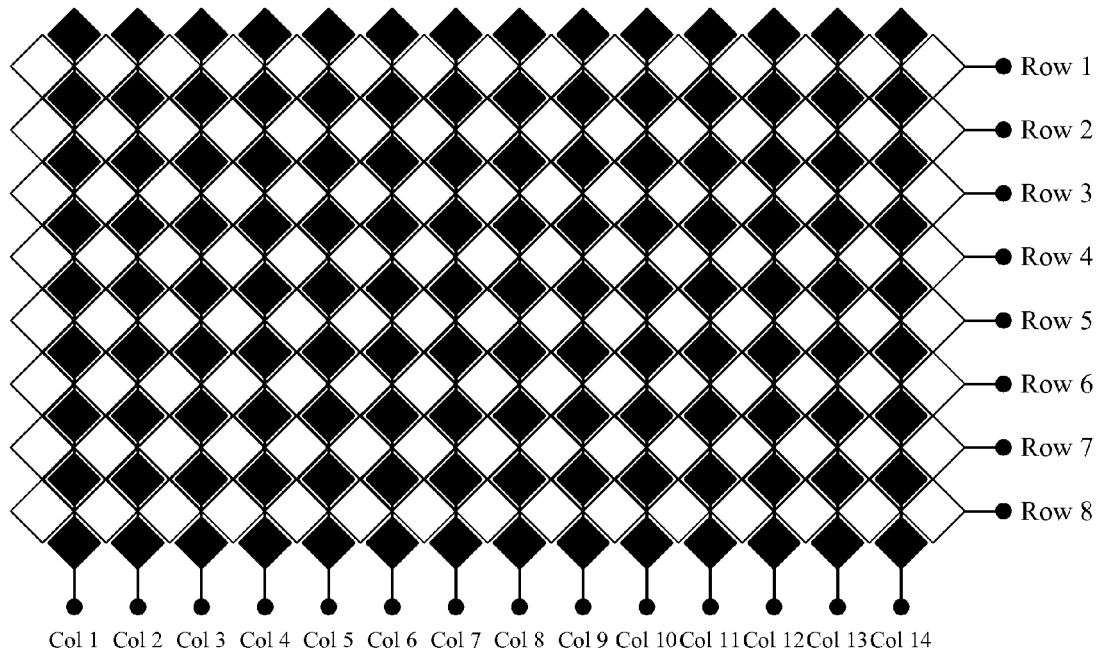
FIG. 2 illustrates an exemplary array of capacitive touch sensors, referred to collectively as a touch panel, used as a capacitance touch interface.

FIG. 2 illustrates an exemplary array of capacitive touch sensors, referred to collectively as a touch panel, used as a capacitance touch interface. The touch sensors are configured into rows and columns. The white diamonds are the row touch sensors and the shaded diamonds are the column touch sensors. All white diamonds in a given row, for example the 15 white diamonds in row 1, are serially connected via bridges to form one single row sensor. Similarly, all black diamonds in a given column are serially connected to form one single column sensor. In this exemplary configuration, the touch panel includes 8 row sensors and 14 column sensors.

When a finger or a conductive stylus approaches the touch panel, at the area where the touch panel is contacted, the touch sensor capacitance changes, or in the case of the two-dimensional array of touch sensors in FIG. 2, the capacitance of a row or column changes. An analog front end (AFE) circuit converts the capacitance detected by the touch sensor/row to a proportional voltage. The AFE outputs the converted voltage to an analog-to-digital converter (ADC), which coverts the voltage to a digital code representation. The noise sources can change the output of the AFE. In the absence of incident noise, a normal touch causes the ADC output to be at a few hundred codes. However, in the presence of incident noise, an un-touched sensor can also cause the ADC output to be at a few hundred codes. In this case, the touchpad circuit 20 can not distinguish between an actual touch versus a non-touch with noise coupling.

The differential sensing scheme provides a means for detecting a touch event in the presence of incident noise. Instead of sensing one touch sensor/row at a time, multiple touch sensors/rows are sampled at a time. The incident noise is often coupled to the touch sensors with similar if not the same strength. This is especially true for touch sensors that are of the same shape and size and placed in close proximity to each other. By sampling two nearby touch sensors/rows simultaneously and doing the measurement differentially, noise common to both touch sensors/rows is cancelled. The differential sensing scheme is implemented using simple switch-capacitor AFE circuitry. Unlike conventional capacitive sensing schemes, no external RC component or complex analog filtering is required in the differential sensing scheme to filter out the noise.

Figure 3:
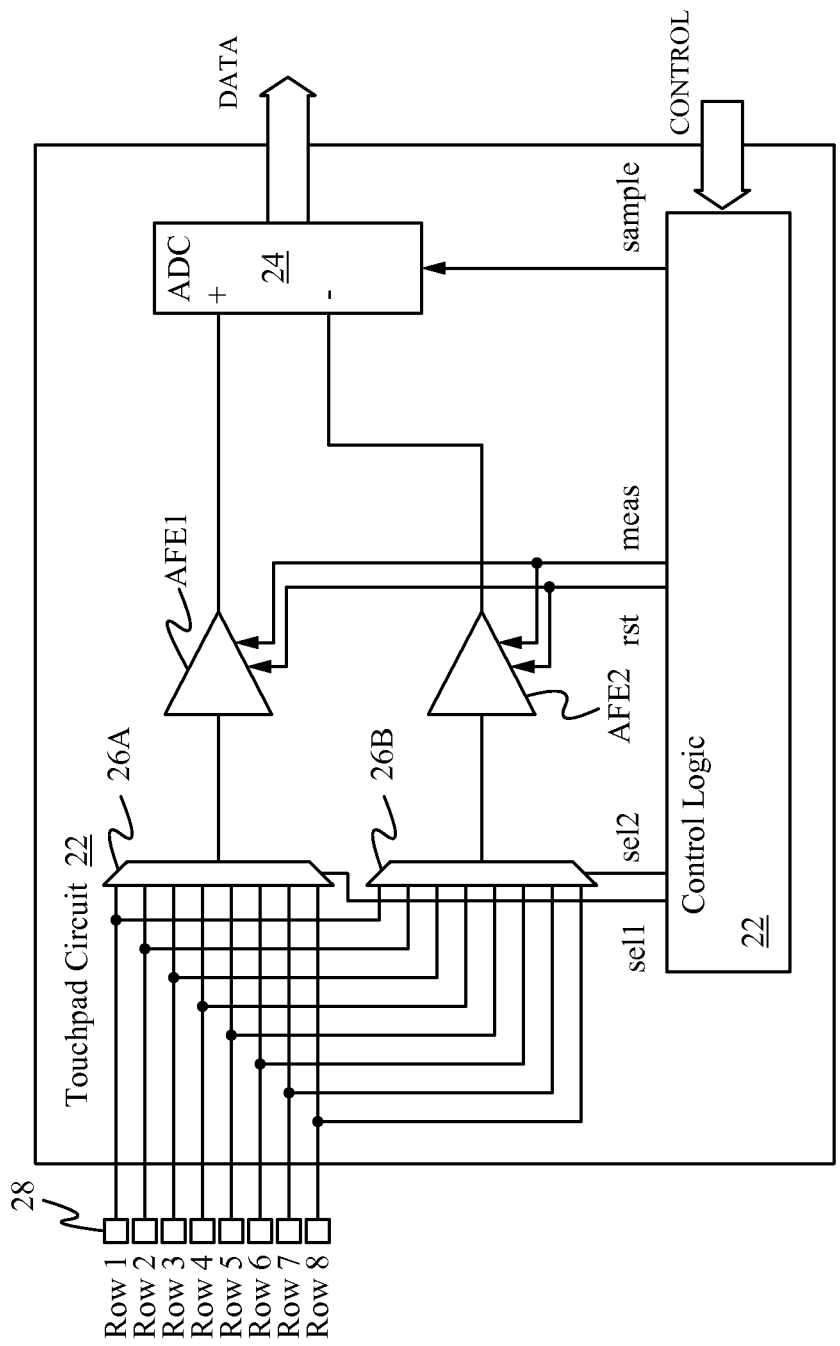
FIG. 3 illustrates a schematic diagram of the touchpad circuit according to an embodiment of the present invention.

FIG. 3 illustrates a schematic diagram of the touchpad circuit 20 according to an embodiment of the present invention. The touchpad circuit 20 is configured to output differential sensed data that is subsequently processed to determine a real touch event and the related coordinates on the touch panel of the real touch event. The touchpad circuit 20 includes a pair of multiplexers 26A and 26B coupled to each row of touchpad elements 28. The configuration of FIG. 3 matches the configuration of the touch panel of FIG. 2. As such, there are eight touchpad elements 28, each touchpad element 28 corresponding to one of the eight rows in the touch panel of FIG. 2. Single touchpad elements 28 are illustrated in FIG. 3, but it is understood that both one and two-dimensional touchpad elements can be implemented. For example, additional similar circuitry as that shown in FIG. 3 can be implemented to determine sensed data for the columns of the touch panel. In this case, the number of touchpad elements in the additional circuitry corresponds to the number of columns in the touch panel. A multiplexer 26A selects a first channel, such as row 1, from among touchpad elements 28 and a multiplexer 26B selects another second channel, such as row 2, from among touchpad elements 28. As used herein, a channel refers to a row sensor or a column sensor, as in the two-dimensional touch panel of FIG. 2, or to a single touch sensor in a one-dimensional panel. A pair of AFE circuits AFE1 and AFE2 measure the capacitances at the output of the multiplexers 26A and 26B, respectively, which will change due to the presence of a finger/stylus near the selected touchpad elements 28.

A control logic circuit 22 provides a reset signal rst for resetting AFE1 and AFE2 circuits, which prepares AFE1 and AFE2 circuits to make capacitance measurements. In some embodiments, the control logic 22 is under the control of system host processor, such as the microprocessor 14 in mobile telephone 10 of FIG. 1. Selection values sel1 and sel2 are set at address inputs of the multiplexers 26A and 26B for selecting the touchpad elements 28 to be measured prior to performing the measurement. Reset signal rst is de-asserted, permitting AFE 1 and AFE2 circuits to measure the capacitance of the respective selected touchpad elements 28. The outputs of the AFE1 and AFE2 circuits are applied differentially to inputs of an analog-to-digital converter (ADC) 24. The ADC 24 provides digital values corresponding to the difference between the capacitances measured at the outputs of the multiplexers 26A and 26B, after a sample control signal is asserted for sampling the outputs of the AFE1 and AFE2 circuits. As a result, any common-mode noise and offset present at the outputs of the multiplexers 26A and 26B is canceled in the output of ADC 24.

Figure 4:
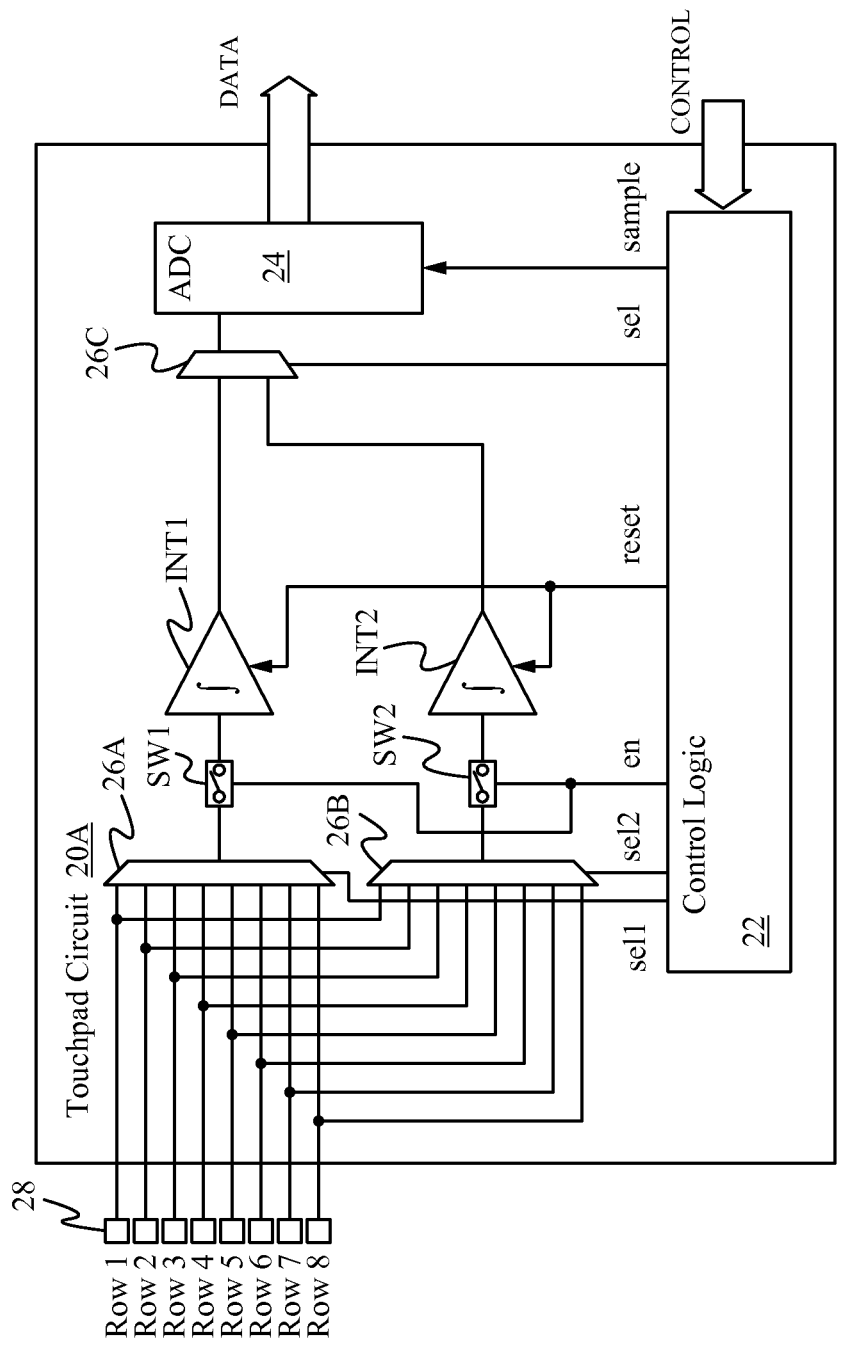
FIG. 4 illustrates another embodiment of a touchpad circuit that can alternatively be used to implement the touchpad circuit of FIG. 1.

In some embodiments, the touchpad circuit 20 and the AFE1 and AFE2 circuits are configured as capacitance measuring circuits. In other embodiments, the touchpad circuit is alternatively configured so that the differential sensing scheme can be used with voltage measuring type capacitive sensor arrangements. Referring now to FIG. 4, a touchpad circuit 20A, that can be used to implement touchpad circuit 20 in mobile telephone 10 of FIG. 1, is shown in accordance with an alternative embodiment of the present invention. The touchpad circuit 20A is similar to the touchpad circuit 20 described above, and therefore only differences between them are described below. Instead of capacitance measuring circuits, a pair of integrators INT1 and INT2, integrate the corresponding voltages at the output of multiplexers 26A and 26B, respectively, so that the differential sensing scheme can be used with voltage-measuring type capacitive sensor arrangements. An enable signal en enables switches SW1 and SW2 to cause integrators INT1 and INT2 to start integrating the voltage of corresponding selected ones of touchpad elements 28.

The control logic circuit 22 provides a reset signal reset for resetting integrators INT1 and INT2. Integrators INT1 and INT2 are reset while selection values sel1 and sel2 are set at address inputs of the multiplexers 26A and 26B for selecting the measurement element voltage and reference element voltage provided to integrators INT1 and INT2, respectively. Reset signal reset is de-asserted, permitting integrators INT1 and INT2 to integrate the voltages present on the respective selected touchpad elements 28. Another multiplexer 26C is provided for selecting between the outputs of the integrators INT1 and INT2, according to a selection signal sel provided by control logic 22. The selected output is received as the input of the ADC 24, which provides digital values corresponding to the output voltages of integrators INT1 and INT2 at the end of a measurement interval, after a sample control signal is asserted for sampling the outputs of integrators INT1 and INT2.

Figure 5:
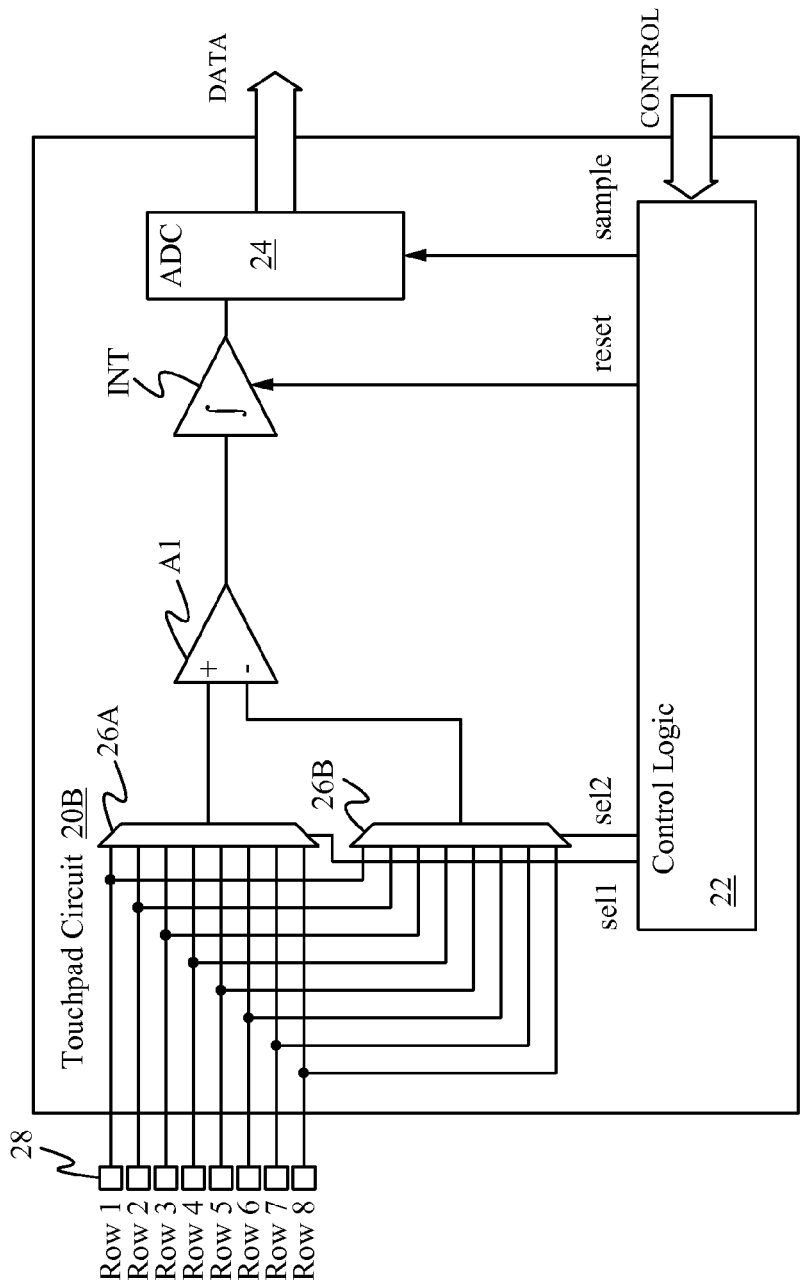
FIG. 5 illustrates yet another embodiment of a touchpad circuit that can alternatively be used to implement the touchpad circuit of FIG. 1.

FIG. 5 illustrates another embodiment of a touchpad circuit that can alternatively be used to implement touchpad circuit 20 in mobile telephone 10 of FIG. 1. The touchpad circuit 20B of FIG. 5 is similar to touchpad circuit 20A of FIG. 4, and therefore only differences between them are described below. The touchpad circuit 20B has a single integrator INT that is provided with an input signal representing a difference between the voltages on the measurement touchpad element selected by the multiplexer 26A and the reference touchpad element selected by the multiplexer 26B, as provided from a differential amplifier A1. The difference between the operation of the touchpad circuit 20B and the touchpad circuit 20A of FIG. 4 is that in the touchpad circuit 20B, the instantaneous values of the voltages are subtracted and then integrated, while in the touchpad circuit 20A of FIG. 4, the integral of each of the voltages is available to the microprocessor 14, which computes the difference, but may make other corrections/computations based upon the separately obtained integrated values.

Referring again to FIG. 3, the differential sensed data output from the ADC 24 is processed to determine if a touch event occurred, and if so, where on the touch panel the touch event occurred. In some embodiments, the differential sensed data is processed by the microprocessor 14 in FIG. 1. In general, the differential sensed data is processed by a system host controller or other applications processor.

In some embodiments of the differential sensing scheme, two channels are sampled at the same time. A first channel is the channel under measurement, referred to as a primary channel, and the output of the first channel is connected to the positive input of the ADC. The output of the second channel, referred to as a reference channel, is connected to the negative input of the ADC. The ADC converts these two inputs differentially to a digital code. The differential sensing scheme operates most effectively if the reference channel has the extraneous incident noise present as a common mode signal. For optimum performance, the two differential channels should be identical in shape and size and physically positioned as close to each other as possible. For this reason, the neighboring channel is preferably chosen as the reference channel since it has the maximum probability of picking-up the same noise as the first channel being measured. For example, when sampling the row 1, row 2 is selected as reference channel and for row 2, row 3 as reference and so on. For eight rows only seven conversions are done. The last row is not sampled. Similarly for column 1, column 2 is the preferred reference channel and for column 2, column 3 is the preferred reference and so on. The last column is not sampled.

FIG. 6 illustrates an exemplary set of measurements and calculations corresponding to implementation of the differential sensing scheme in a single touch application. In the data populating FIG. 6, a finger or stylus is present at rows 2 and 3 of the exemplary eight-row capacitive sensor array of FIG. 2. The "No Touch Single Ended" line of FIG. 6, labeled as step S1, is the value measured for each selected row without any differential adjustment using a reference row measurement. In other words, the values in step S1 are values determined when each row is individually measured with no touch event. The "Assumed Code Change due to TOUCH" line, labeled as step S2, shows results that are the ideal code change values in the absence of noise when the finger/stylus is present at rows 2 and 3. The values are previously known values that are expected for the type of touch sensor being used. In the example of FIG. 6, the ideal code change in row 3 is greater than the ideal code change in row 2, which indicates that the touch event is closer to row 3 than row 2. It is understood that other ideal code changes are used to indicate other relative positions of the touch event to the two rows. The values shown in FIG. 6 for step S2 correspond to values associated with a "light touch". For a "firmer touch", higher values are expected. The "Touched Single Ended" line, labeled as step S3, shows results that are the actual measured values of the single ended measurement row (primary channel) without compensation for noise. This is comparable to the step S1 but includes the exemplary touch event corresponding to touching rows 2 and 3. The "No Touch Differential (Baseline)" line, labeled as step S4, shows the baseline calculated differentially without touch on any row. The values shown in step S4 are calculated by subtracting the step S1 value of the reference row from the step S1 value of the measured row. For example, the value 200 in step S4 for row 1 (measured row) is determined by subtracting the value 1900 in step S1 for row 2 (reference row) from the value 2100 in step S1 for row 1.

Similarly, the "Touched Differential Measurement" line, labeled as step S5, shows results that are the step S3 results adjusted using the step S3 results from the reference row measurement. In other words, the step S5 results are calculated by subtracting the step S3 results of the reference row from the step S3 of the measured row. For example, the value 190 in step S5 for row 1 (measured row) is determined by subtracting the value 1910 in step S3 for row 2 (reference row) from the value 2100 in step S3 for row 1. The "Delta from Baseline" line, labeled as step S6, shows results that are the differences between the No Touch Differential (baseline) row values in step S4 and the Touched Differential Measurement row values in step S5. For example, the value −10 in step S6 for row 1 is calculated by subtracting the value 190 in step S5 for row 1 from the value 200 in step S4 for row 1.

Figure 7:
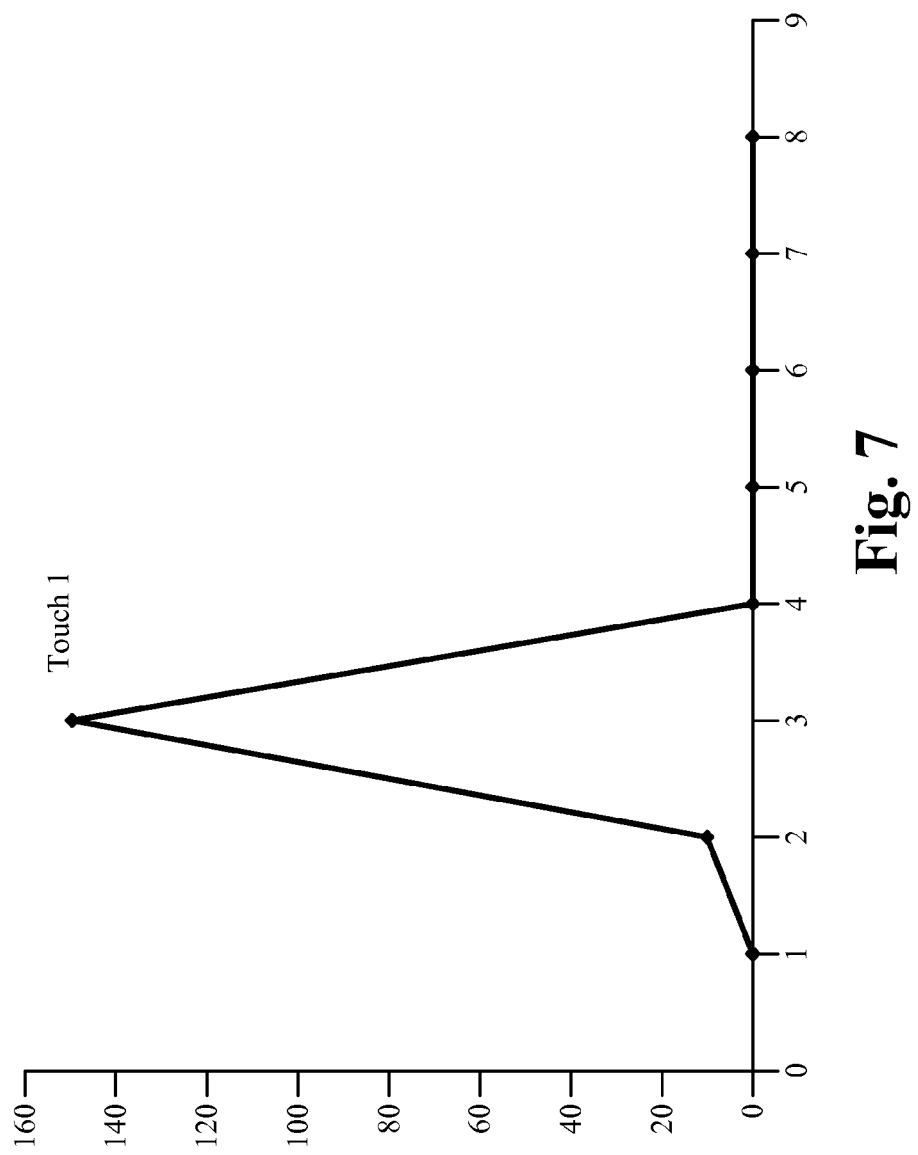
FIG. 7 illustrates graphically the results in step S8 of FIG. 6.

The "Cumulative Sum" line, labeled as step S7, shows the cumulative sum of delta change for each row starting from the last row, row 8. The cumulative sum is defined as the sum of delta change for the present row and the cumulative sum of the previous row. For example, the cumulative sum for row 3 is the delta change for row 3, shown in step S6 for row 3, plus the cumulative sum for row 4. As applied to the values in FIG. 6, the cumulative value for row 3 is the value 150 in step S6 for row 3 plus the value 0 in step S7 for row 4. The "Minimum from Segment" column is the least value in step S6. This value is used to normalize the values in step S7 to remove any error due to offset between the reference element voltages. Normalizing the code values in step S7 by the Minimum from Segment values yields the "Calculated Code Change due to TOUCH" line, labeled as step S8, which is identical to the expected results "Assumed Code Change due to TOUCH" in step S2. FIG. 7 illustrates graphically the results in step S8 of FIG. 6.

In the delta from baseline, row 3 shows an increase in the ADC code as the "Assumed Code Change due to TOUCH" from row 3 to row 4 is maximum. Row 2 shows the maximum negative change from the baseline because the "Assumed Code Change due to TOUCH" from row 2 to row 3 is most negative. The remaining channels, row 4 to row 8, do not show any delta change since the neighboring channels also show zero delta change from baseline. The last row, row 8, is not sampled hence the delta change is zero.

The preceding example was applied to rows of touch sensors. This technique is also applied to columns of touch sensors, the results of which are combined with the results from the row analysis to determine the row and column position of the touch event on the touch panel. This process is well known in the art.

Figure 9:
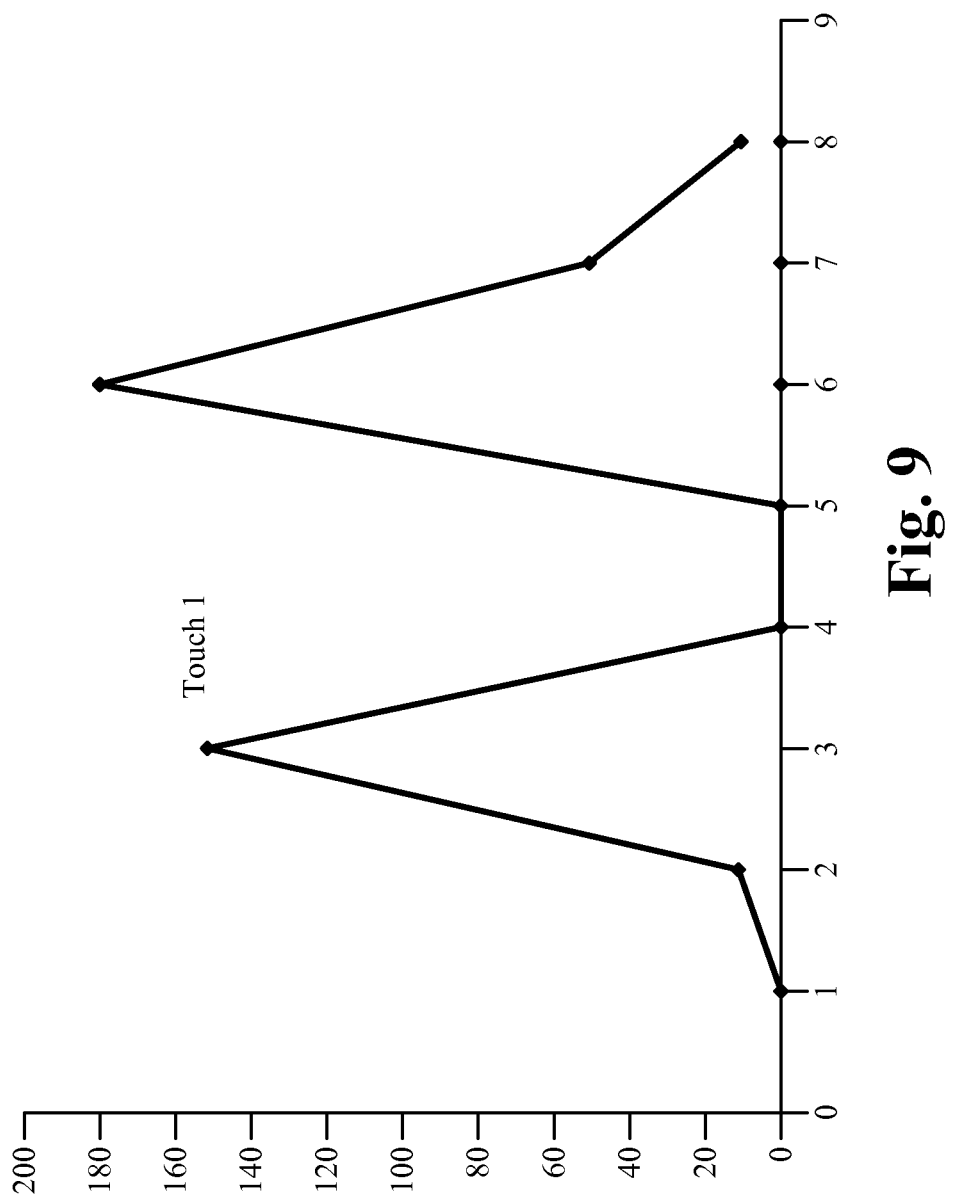
FIG. 9 illustrates graphically the results in step S8 of FIG. 8.

FIGS. 6 and 7 show an exemplary application of the differential sensing scheme during a single touch event. These techniques can be similarly applied to multiple touch events, or multi-touch. FIG. 8 illustrates an exemplary set of measurements and calculations corresponding to implementation of the differential sensing scheme in a multi-touch application. The measurements and calculations are similar to those described above for FIG. 6, therefore only differences between them will be described below. In the data depicted in FIG. 8, a finger/stylus is present at rows 2-3 and at rows 6-8. Touch on row 2 and row 3 together forms the first touch and the touch on row 6, row 7, and row 8 together forms the second touch. The touch at rows 1-2 is independent of the touch at rows 6-8. FIG. 9 illustrates graphically the results in step S8 of FIG. 8.

In general, depending on the layout of the sensors, the touch can be present on one or more sensors. Here it is assumed that the touch covers two or more sensors, specifically two sensors for the first touch and three sensors for the second touch. The algorithm also works if the touch covers one or more sensors. The same applies to one touch applications.

Figure 10:
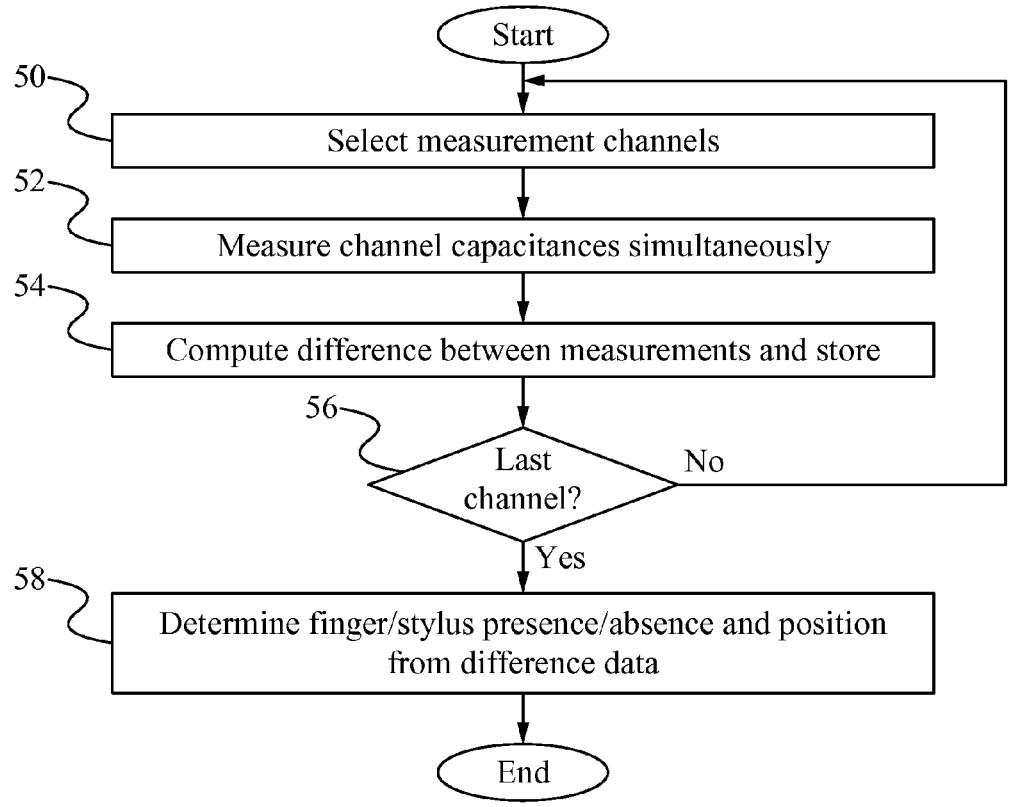
FIG. 10 illustrates a method of determining a touch event and a position of the touch event in accordance with an embodiment of the present invention.

FIG. 10 illustrates a method of determining a touch event and a position of the touch event in accordance with an embodiment of the present invention. All or portions of the depicted method may be performed by a system host controller, such as the microprocessor 14 in mobile telephone 10 of FIG. 1, according to control by program instructions forming a computer-program product stored in memory 15. At the step 50, a pair of touch sensitive channels are selected. The channels have the same or similar shape and size in order to provide for canceling noise that is picked up by the other channel. Each channel represents either a single touch sensor or an array of touch sensors such as a row or a column. At the step 52, the capacitance of the channels are measured simultaneously, so that any common mode noise generates an equal error in the measurements. Alternatively, the voltages on two voltage-coupling type elements can be integrated in accordance with the alternative embodiments shown in FIG. 4 and FIG. 5. At the step 54, the difference between the measurement results for the two channels is computed and the result stored. At the step 56, it is determined if the last channel to be measured has not been reached. If it is determined that the last channel has not been reached, then the steps 50-54 are repeated for the other channels. After the last channel has been reached at the step 56, then at the step 58 the finger or stylus absence/presence is determined from the difference data and if the finger/stylus is present, the position is determined.

Figure 11:
FIG. 11 illustrates a block diagram of a four sensor slider.

The differential sensing scheme is described above in the context of a two-dimensional array of touch sensors, such as the touch panel of FIG. 2. The differential sensing scheme can also be applied to a one-dimensional array of touch sensors, where each individual touch sensor is measured, as opposed to a row or column of touch sensors. An example of such a one-dimensional application is applying the differential sensing scheme to virtual sliders and scroll wheels. FIG. 11 illustrates a block diagram of a four sensor slider. Sensor 1 can be sampled differentially with respect to sensor 2. Sensor 2 can be sampled with respect to sensor 3, and sensor 3 can be sampled with respect to sensor 4. The techniques described in relation to FIGS. 6 and 8 can be similarly applied to this one-dimensional configuration.

Figure 12:
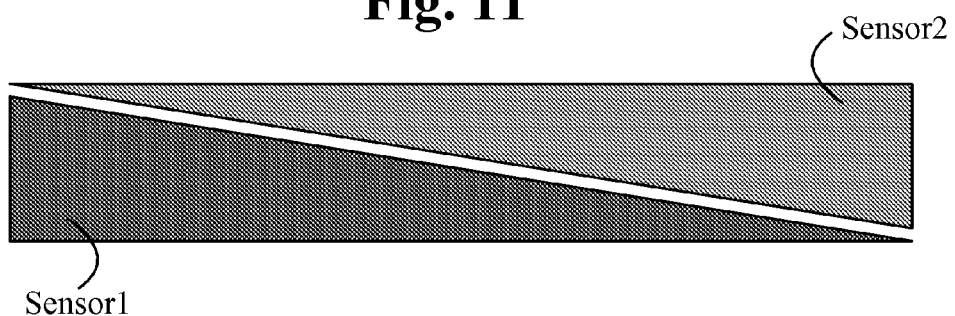
FIG. 12 illustrates a block diagram of a two sensor slider.

The one-dimensional touch sensor array can be applied to any array having two or more sensors. In the case of a two sensor array, such as the two sensor slider shown in FIG. 12, a single differential measurement between sensor 1 and sensor 2 is enough to give the position of the touch event. If the touch event is on the left side of the slider, the measurement is most positive, and if the touch event is on the right side of the slider, the measurement is most negative. If the touch event is at the center of the slider, the differential measurement is zero.

Figure 13:
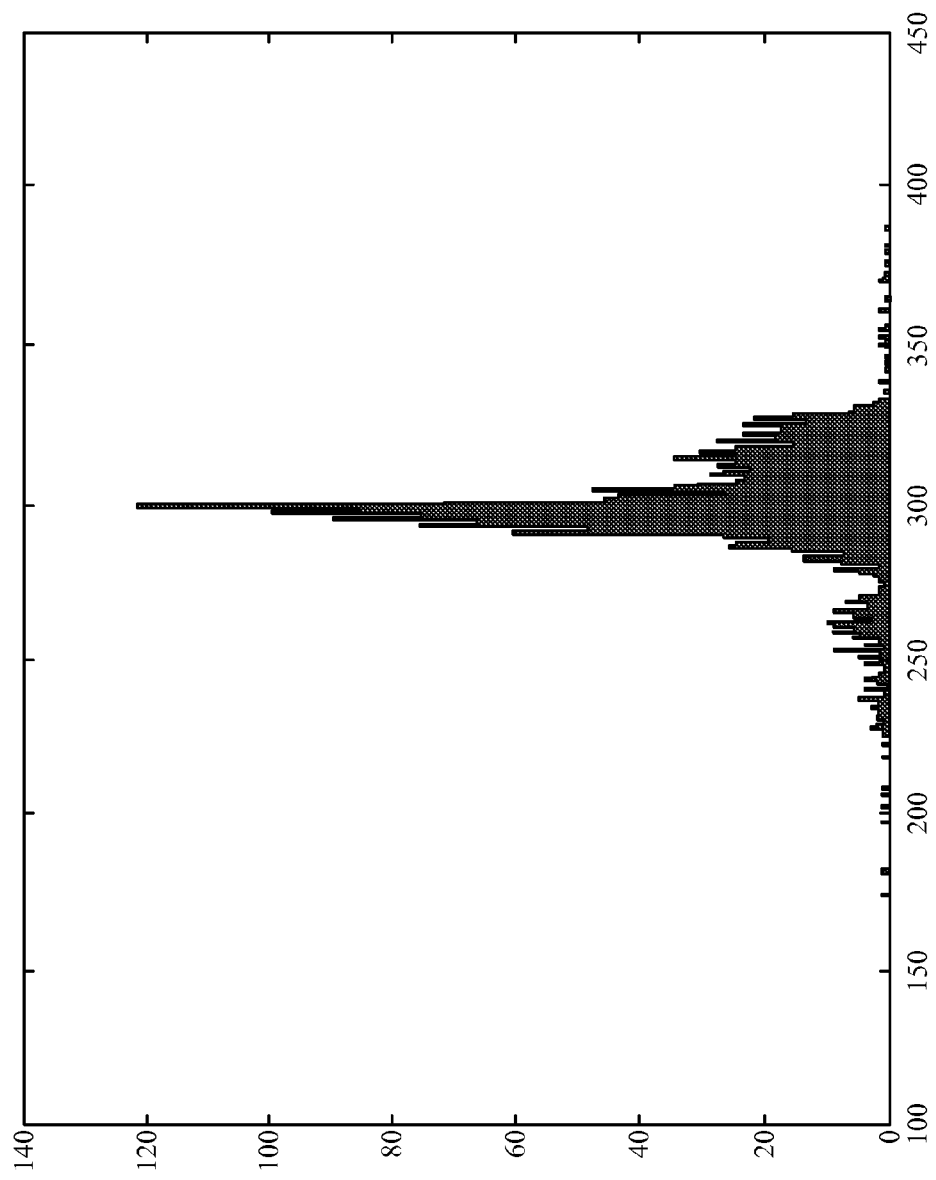
Figure 14:
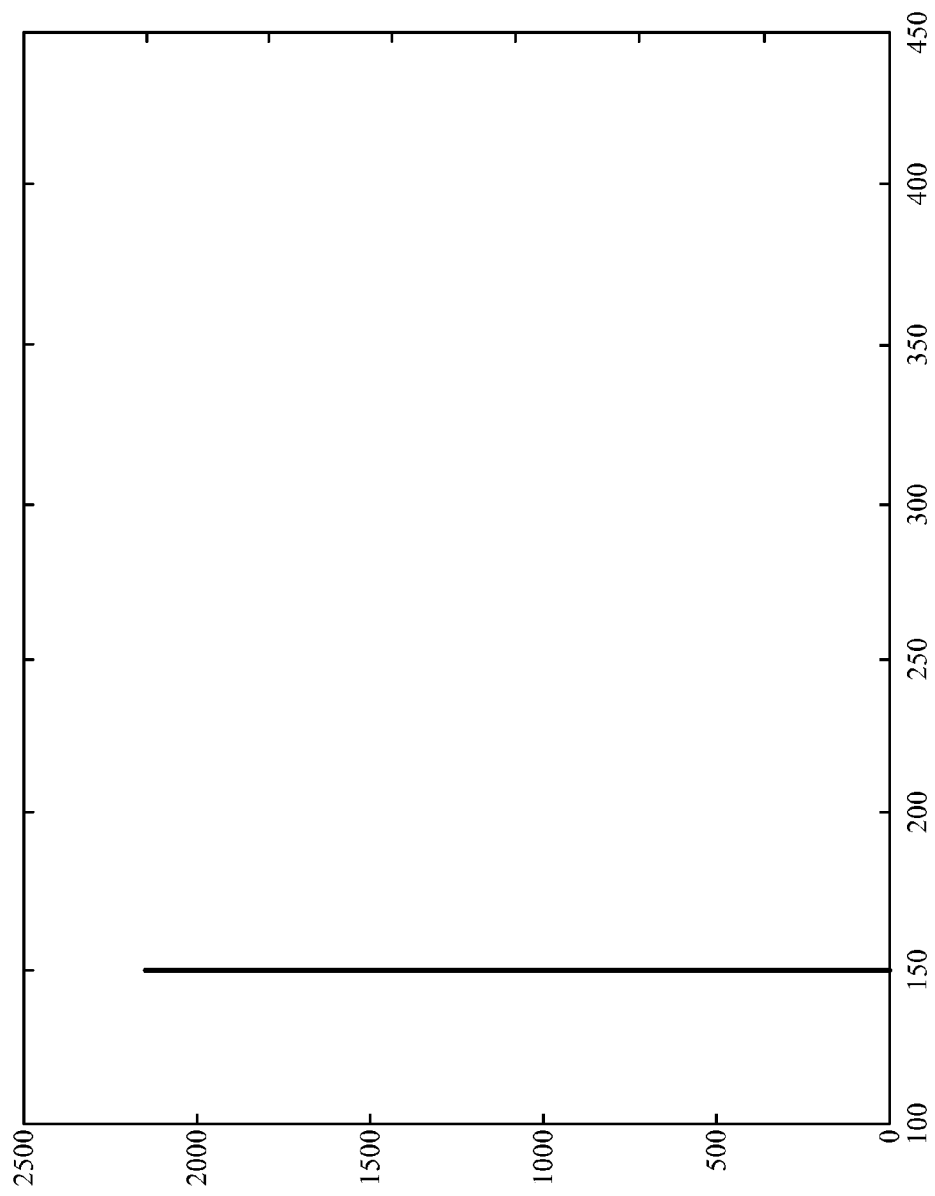

In an exemplary application, the differential sensing scheme was implemented using parts from Maxim Integrated Products, Inc.™. When a touch panel was put on top of a LCD screen and a single ended sensing scheme was applied, the resulting performance was noisy and many false touches were detected. FIG. 13 shows an histogram of raw data captured for single ended measurements on a 7" touch panel with LCD on. In this example, the standard deviation was 21.8 codes. The differential sampling scheme using adjacent sampled channels was used to reduce the effect of the noise. Most of the noise generated by the LCD was cancelled and the performance was very close to that without LCD electronics in its proximity. FIG. 14 shows an histogram of raw data captured for differential sensing measurements on the same 7" panel with LCD on. The standard deviation improved from 21.8 codes to 0.9 when the capture method was changed to differential from single ended.

As described above, the differential sensing scheme is applied as an adjacent channel implementation, meaning that immediately adjacent touch sensors, row, or columns are used for the differential measurements. Alternatively, the differential sensing scheme can be expanded to include differential comparisons between non-adjacent touch sensors, rows, or columns. For example row 1 and row 3, row 2 and row 4, row 3 and row 5, and so on can be compared. As another example, row 1 and row 4, row 2 and row 5, row 3 and row 6, and so on can be compared.

As described above, the differential sensing scheme is applied to two sensors, rows, or columns, for example determining the difference between row 1 and row 2. Alternatively, the differential sensing scheme can be applied to more than two sensors, row, or columns.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A method of detecting one or more touch events on a touch sensitive device comprising;
   a. receiving a plurality of channels, each channel having sensed data corresponding to the touch sensitive device;
   b. measuring a capacitance of each channel when no touch event is present on any of the plurality of channels, thereby determining a no touch baseline value for each channel;
   c. selecting one of the plurality of channels as a primary channel;
   d. selecting another of the plurality of channels as a references channel, wherein the reference channel is different than the primary channel;
   e. measuring a capacitance of the primary channel;
   f. measuring a capacitance of the reference channel;
   g. calculating a difference between the measured capacitance of the primary channel and the measured capacitance of the reference channel, thereby determining a measured difference;
   h. calculating a difference between the no touch baseline value for the primary channel and the no touch baseline value for the reference channel, thereby determining a baseline difference;
   i. calculating a difference between the measured difference and the baseline difference, thereby determining a delta from baseline for the primary channel and reference channel pair;
   j. repeating steps c-h for each channel in the plurality of channels so that each channel is selected as the primary channel; and
   k. determining one or more touch events from the delta from baselines calculated for all primary channel and reference channel pairs.

2. The method of claim 1 wherein the capacitance of the primary channel and the capacitance of the reference channel are measured simultaneously.

3. The method of claim 1 wherein each channel is configured having a same shape and size.

4. The method of claim 1 wherein each channel comprises a row sensor in the touch sensitive device.

5. The method of claim 1 wherein each channel comprises a column sensor in the touch sensitive device.

6. The method of claim 1 wherein the touch sensitive device comprises a two-dimensional touch panel.

7. The method of claim 1 wherein the touch sensitive device comprises a one-dimensional virtual slider.

8. The method of claim 1 wherein the primary channel and the reference channel each have common-mode noise that is removed in the delta from baseline.

9. The method of claim 1 wherein the primary channel and the reference channel are adjacent channels.

10. The method of claim 1 wherein selecting the primary channel and the reference channel comprises enabling the primary channel and the reference channel.

11. The method of claim 1 further comprising recovering the sensed data from the primary channel and the reference channel after calculating the delta from baseline for the primary channel and reference channel pair.

12. The method of claim 11 wherein recovering the sensed data comprises performing an integration backwards on the delta from baselines calculated for all primary channel and reference channel pairs, wherein the delta from baselines are sequentially calculated forward starting from a first channel to a last channel, and the integration backwards starts from a last delta from baseline calculated to a first delta from baseline.

13. The method of claim 11 further comprising determining a minimum delta from baseline from the delta from baselines determined for all primary channel and reference channel pairs.

14. The method of claim 13 further comprising calculating adjusted sensed data for each channel by subtracting the minimum delta from baseline from the recovered sensed data for each channel.

15. The method of claim 14 wherein common mode noise present in the sensed data is not present in the adjusted sensed data.

16. The method of claim 1 wherein determining one or more touch events comprises determining multiple touch events.

17. A method of detecting one or more touch events on a touch panel comprising;
 a. receiving a plurality of channels, each channel having sensed data corresponding to the touch panel;
 b. determining a capacitance of each channel when no touch event is present on any of the plurality of channels, thereby determining a no touch baseline value for each channel;
 c. selecting two of the plurality of channels and calculating a difference between the no touch baseline value for the two channels, thereby determining a baseline difference;
 d. measuring a capacitance of each of the selected two channels;
 e. calculating a difference between the measured capacitances of the two channels, thereby determining a measured difference where a common-mode noise present in both of the selectively measured two channel is removed;
 f. calculating a difference between the measured difference and the baseline difference, thereby determining a delta from baseline for the two channels;
 g. repeating steps c-f for additional channel pairs in the plurality of channels; and
 h. recovering the sensed data from all the delta from baselines for the channel pairs, wherein the recovered sensed data does not include common-mode noise present in the sensed data; and
 i. determining one or more touch events from the recovered sensed data.

18. The method of claim 17 wherein the capacitances of each of the selected two channels are measured simultaneously.

19. The method of claim 17 wherein each channel is configured having a same shape and size.

20. The method of claim 17 wherein each channel comprises a row sensor in the touch sensitive device.

21. The method of claim 17 wherein each channel comprises a column sensor in the touch sensitive device.

22. The method of claim 17 wherein the touch sensitive device comprises a two-dimensional touch panel.

23. The method of claim 17 wherein the touch sensitive device comprises a one-dimensional virtual slider.

24. The method of claim 17 wherein the two channels are adjacent channels.

25. The method of claim 17 wherein selecting two channels comprises enabling the two channels.

26. The method of claim 17 wherein recovering the sensed data comprises performing an integration backwards on the delta from baselines calculated for all channel pairs, wherein the delta from baselines are sequentially calculated forward starting from a first channel to a last channel, and the integration backwards starts from a last delta from baseline calculated to a first delta from baseline.

27. The method of claim 26 further comprising determining a minimum delta from baseline from the delta from baselines determined for all channel pairs.

28. The method of claim 27 further comprising calculating adjusted sensed data for each channel by subtracting the minimum delta from baseline from the recovered sensed data for each channel.

29. The method of claim 17 wherein determining one or more touch events comprises determining multiple touch events.

30. A method of detecting one or more touch events on a touch panel comprising;
 a. receiving a plurality of channels, each channel having sensed data corresponding to the touch panel;
 b. determining a capacitance of each channel when no touch event is present on any of the plurality of channels, thereby determining a no touch baseline value for each channel;
 c. selecting N of the plurality of channels and calculating a difference between the no touch baseline value for the N channels, thereby determining a baseline difference;
 d. measuring a capacitance of each of the selected N channels;
 e. calculating a difference between the measured capacitances of the N channels, thereby determining a measured difference where a common-mode noise present in the selectively measured N channels is removed;
 f. calculating a difference between the measured difference and the baseline difference, thereby determining a delta from baseline for the N channels;
 g. repeating steps c-f for additional channel sets in the plurality of channels;

h. recovering the sensed data from all the delta from baselines for the channel sets, wherein the recovered sensed data does not include common-mode noise present in the sensed data; and
i. determining one or more touch events from the recovered sensed data.

\* \* \* \* \*